US012687565B2

(12) United States Patent
Mikkola et al.

(10) Patent No.: US 12,687,565 B2
(45) Date of Patent: Jul. 21, 2026

(54) SYSTEMS AND METHODS FOR SIGNAL SAMPLING USING A SAMPLING ARRAY

(71) Applicant: Alphacore, Inc., Tempe, AZ (US)

(72) Inventors: Esko Mikkola, Mesa, AZ (US);
Phaneendra Bikkina, Tempe, AZ (US)

(73) Assignee: Alphacore, Inc., Tempe, AZ (US)

( * ) Notice: Subject to any disclaimer, the term of this patent is extended or adjusted under 35 U.S.C. 154(b) by 309 days.

(21) Appl. No.: 18/410,536

(22) Filed: Jan. 11, 2024

(65) Prior Publication Data

US 2024/0230738 A1     Jul. 11, 2024

Related U.S. Application Data

(60) Provisional application No. 63/438,352, filed on Jan. 11, 2023.

(51) Int. Cl.
*G01R 27/26* (2006.01)
*H03M 1/46* (2006.01)
(52) U.S. Cl.
CPC ........ *G01R 27/2605* (2013.01); *H03M 1/468* (2013.01)

(58) Field of Classification Search
CPC .... G01R 27/2605; H03M 1/468; H03M 1/08; H03M 1/1061; H03M 1/0607
See application file for complete search history.

(56) References Cited

U.S. PATENT DOCUMENTS

2015/0263756 A1* 9/2015 Chiu ....................... H03M 1/08
341/172

* cited by examiner

*Primary Examiner* — Amy He
(74) *Attorney, Agent, or Firm* — LOZA & LOZA, LLP

(57)     ABSTRACT

Systems and methods for sampling signals are disclosed. In an example, a system includes a capacitive sampling array having an input interface, an output interface, and capacitive sampling channels connected in parallel between the input interface and the output interface, wherein each capacitive sampling channel has a channel-specific capacitor having a channel-specific capacitance, a readout system coupled to the output interface of the capacitive sampling array and configured to generate digital data in response to a signal received on the input interface of the capacitive sampling array, and a controller coupled to the readout system to receive the digital data and configured to select capacitive sampling channels of the capacitive sampling array to sample the signal in response to the digital data.

18 Claims, 11 Drawing Sheets

SYSTEMS AND METHODS FOR SIGNAL SAMPLING USING A SAMPLING ARRAY

CROSS-REFERENCE TO RELATED APPLICATION

This application claims priority to provisional U.S. Patent Application Ser. No. 63/438,352, filed Jan. 11, 2023, which is incorporated by reference herein.

BACKGROUND

Techniques for signal sampling, digitization, and/or frequency domain analysis often involve capacitive sampling. In some applications, such as impulse radar ("radio detection and ranging") and lidar ("light detection and ranging"), the signals that are received at the sensor can vary greatly in magnitude, putting demands on a capacitive sensor to be able to have a wide dynamic range while maintaining an acceptable signal-to-noise ratio (SNR).

SUMMARY

Systems and methods for sampling signals are disclosed. In an example, a system includes a capacitive sampling array having an input interface, an output interface, and capacitive sampling channels connected in parallel between the input interface and the output interface, wherein each capacitive sampling channel has a channel-specific capacitor having a channel-specific capacitance, a readout system coupled to the output interface of the capacitive sampling array and configured to generate digital data in response to a signal received on the input interface of the capacitive sampling array, and a controller coupled to the readout system to receive the digital data and configured to select capacitive sampling channels of the capacitive sampling array to sample the signal in response to the digital data.

In an example, the controller is configured to change a pattern of sampling instances in a frame of sampling instances in response to a magnitude of the signal received on the input interface, wherein a sampling instance includes a selected capacitive sampling channel.

In an example, the controller is further configured to change a capacitive sampling channel of a sampling instance in the frame to a capacitive sampling channel with a smaller capacitance in response to a portion of the signal that has a higher magnitude than a previous portion of the signal, and change a capacitive sampling channel of a sampling instance in the frame to a capacitive sampling channel with a larger capacitance in response to a portion of the signal that has a lower magnitude than a previous portion of the signal.

In an example, the controller is further configured to select a capacitive sampling channel with a smaller capacitance to correspond to a portion of the signal with a higher magnitude, and select a capacitive sampling channel with a larger capacitance to correspond to a portion of the signal with a lower magnitude.

In an example, the controller is configured to select a capacitive sampling channel from the capacitive sampling channel array for a subsequent sampling instance in response to a magnitude of the signal received on the input interface.

In an example, the controller is further configured to select a capacitive sampling channel for a subsequent sampling instance that has a larger capacitance than a previous sampling instance in response to digital data that indicates a rising edge of the signal, and select a capacitive sampling channel for a subsequent sampling instance that has a smaller capacitance than a previous sampling instance in response to digital data that indicates a falling edge of the signal.

In an example, the channel-specific capacitors of each capacitance sampling channel is a function of a unit capacitor.

In an example, a first capacitive sampling channel in the capacitive sampling array has more unit capacitors than a second capacitive sampling channel array such that the first capacitive sampling channel has a larger capacitance than the second capacitive sampling channel.

In an example, the capacitive sampling channels of the capacitive sampling array include channel-specific switches that enable the capacitive sampling channels to be individually activated for sampling the input signal.

In an example, the controller is further configured to increase a sampling rate of the system in response to a portion of the signal that has a higher magnitude, and decrease the sampling rate of the system in response to a portion of the signal that has a lower magnitude.

A method is also disclosed. In an example, the method involves obtaining a sample of a signal from a capacitive sampling array having an input interface, an output interface, and capacitive sampling channels connected in parallel between the input interface and the output interface, wherein each capacitive sampling channel has a channel-specific capacitor having a channel-specific capacitance, selecting a capacitive sampling channel from the capacitive sampling array for a subsequent sampling instance in response to the sample, controlling the capacitive sampling array to sample the signal in the subsequent sampling instance using the selected capacitive sampling channel.

In an example, selecting a capacitive sampling channel from the capacitive sampling array for a subsequent sampling instance in response to the sample involves changing a pattern of sampling instances in a frame of sampling instances in response to a magnitude of the signal, wherein a sampling instance includes a selected capacitive sampling channel.

In an example, the method further involves changing a capacitive sampling channel of a sampling instance in the frame to a capacitive sampling channel with a smaller capacitance in response to a portion of the signal has a higher magnitude than a previous portion of the signal, and changing a capacitive sampling channel of a sampling instance in the frame to a capacitive sampling channel with a larger capacitance in response to a portion of the signal that has a lower magnitude than a previous portion of the signal.

In an example, selecting a capacitive sampling channel from the capacitive sampling array for a subsequent sampling instance in response to the sample involves selecting a capacitive sampling channel with a smaller capacitance to correspond to a portion of the signal with a higher magnitude, and selecting a capacitive sampling channel with a larger capacitance to correspond to a portion of the signal with a lower magnitude.

In an example, selecting a capacitive sampling channel from the capacitive sampling array for a subsequent sampling instance in response to the sample involves selecting a capacitive sampling channel from the capacitive sampling channel array for a subsequent sampling instance in response to a magnitude of the signal received on the input interface.

In an example, the method further involves selecting a capacitive sampling channel for a subsequent sampling instance that has a smaller capacitance than a previous sampling instance in response to digital data that indicates a rising edge of the signal, and selecting a capacitive sampling channel for a subsequent sampling instance that has a larger capacitance than a previous sampling instance in response to digital data that indicates a falling edge of the signal.

A method for operating a system that samples an input signal is also disclosed. The method involves selecting capacitive sampling channels with large channel-specific capacitance from a capacitive sampling array to sample portions of a signal that have low magnitude, and selecting capacitive sampling channels with small channel-specific capacitance from the capacitive sampling array to sample portions of the signal that have high magnitude, wherein the capacitive sampling array includes an input interface to receive the signal, an output interface, and capacitive sampling channels connected in parallel between the input interface and the output interface, wherein each capacitive sampling channel has a channel-specific capacitor having a channel-specific capacitance, and wherein the large channel-specific capacitance has larger capacitance than the small channel-specific capacitance, and the portions of the signal that have low magnitude have lower magnitude than the portions of the signal that have high magnitude.

In an example, the capacitive sampling channels are selecting in response to digital data generated in response to samples of the signal generated by the capacitive sampling array.

Other aspects in accordance with the invention will become apparent from the following detailed description, taken in conjunction with the accompanying drawings, illustrated by way of example of the principles of the invention.

BRIEF DESCRIPTION OF THE DRAWINGS

Throughout the description, similar reference numbers may be used to identify similar elements.

DETAILED DESCRIPTION

Figure 1:
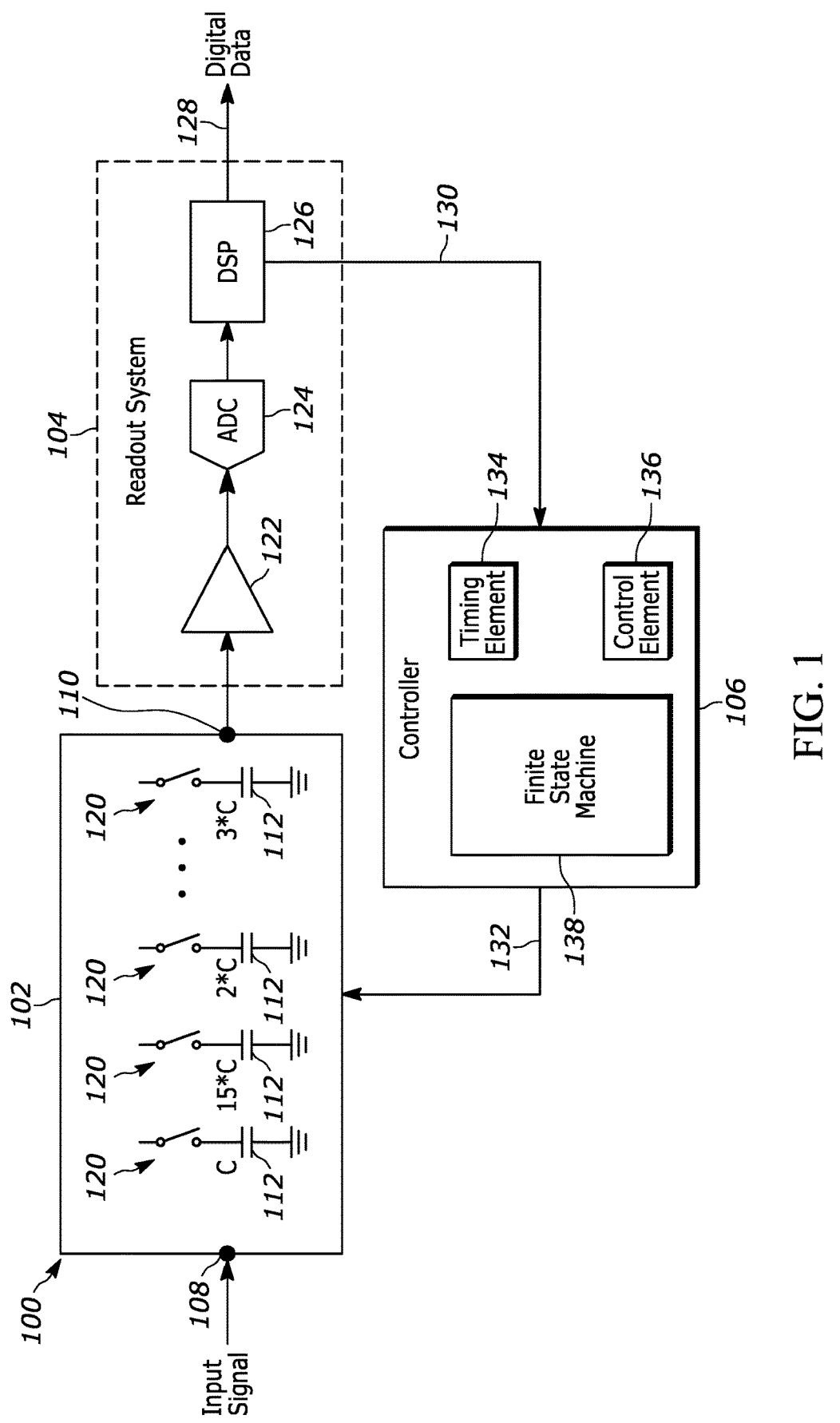
FIG. 1 is an example of a system for sampling a signal that includes a capacitive sensor array, a readout system, and a controller.

It will be readily understood that the components of the embodiments as generally described herein and illustrated in the appended figures could be arranged and designed in a wide variety of different configurations. Thus, the following more detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment", "an embodiment", or similar language means that a particular feature, structure, or characteristic described in connection with the indicated embodiment is included in at least one embodiment of the present invention. Thus, the phrases "in one embodiment", "in an embodiment", and similar language throughout this specification may, but do not necessarily, all refer to the same embodiment.

In some signal sensing applications, such as impulse radar and lidar, the signals that are received at the sensor can vary greatly in magnitude, putting demands on the sensor to be able to have a wide dynamic range while maintaining an acceptable signal-to-noise ratio (SNR). In view of this, it has been realized that a capacitive sensing array with a set of parallel capacitive sampling channels can be dynamically controlled (e.g., tuned) based on feedback from a received signal to select capacitive sampling channels for each sampling instance that are more likely to produce a desirable SNR. For example, capacitive sampling channels with relatively large capacitance are selected to sample portions of the signal that are expected to have a lower magnitude while capacitive sampling channels with relatively small capacitance are selected to sample portions of the signal that are expected to have a higher magnitude. Thus, the sampling technique can adapt its capacitive sampling to generate a signal (e.g., in the form of digital data) that has a desirable SNR over a wide dynamic range. In an example, a system for sampling a signal includes a capacitive sampling array having an input interface, an output interface, and capacitive sampling channels connected in parallel between the input interface and the output interface, wherein each capacitive sampling channel has a channel-specific capacitor having a channel-specific capacitance, a readout system coupled to the output interface of the capacitive sampling array and configured to generate digital data in response to a signal received on the input interface of the capacitive sampling array, and a controller coupled to the readout system to receive the digital data and configured to select capacitive sampling channels of the capacitive sampling array to sample the signal in response to the digital data.

FIG. 1 is an example of a system 100 (sometimes referred to as a quantizer) for sampling a signal that includes a capacitive sensor array 102, a readout system 104, and a controller 106. The capacitive sampling array includes an input interface 108, an output interface 110, and capacitive sampling channels 120 that are connected in parallel between the input interface and the output interface. The capacitive sampling channels each have a channel-specific capacitor 112 that has a channel-specific capacitance. In an example, the channel-specific capacitors are formed using unit capacitors, such that the channel-specific capacitance is a function of the number of unit capacitors that make up the channel-specific capacitor. For example, as illustrated in FIG. 1, a first channel-specific capacitor has a capacitance of C (or "1 C"), a second channel-specific capacitor has a capacitance of 15 C, a third channel-specific capacitor has a capacitance of 2 C, and an Nth channel-specific capacitor has a capacitance of 3 C, where C is a unit capacitance, and N is an integer greater than one. In one example, the channel-specific capacitors are formed by connecting multiple unit capacitors, C. For example, a unit capacitor may have a capacitance of 100 femto Farads (fF). In an example, assume in case 1, a sinusoidal signal of 1 Volts (V) is sampled on to one capacitor of 100 femto Farads (fF), and in case 2, a signal voltage of 300 millivolts (mV) is sampled on to 10 capacitors of 100 fF each. In case 1 of 1V and 100 fF (with thermal noise of 200 uV), it would result in a voltage SNR of 73.98 dB. In case 2 of 300 mV and 10 capacitors of 100 fF each, each of the 10 capacitors registers an SNR of 63.52 dB. However, after averaging, the total SNR in case 2 would be 73.52 dB, which is similar to case 1.

In other examples, the channel-specific capacitors 112 may be formed by capacitive devices that have a desired channel-specific capacitance. In another example, the channel-specific capacitors may be formed by a combination of unit capacitors and capacitors with desired channel-specific capacitance. Examples of the capacitive sampling array 102 are described below with reference to FIGS. 2-4. The capacitive sampling array is controlled by control signals from the controller 106. As is described below, the capacitive sampling channels 120 of the capacitive sampling array may include switches that control which channels in the capacitive sampling array are active for sampling. For example, the switches of the capacitive sampling channels can be controlled to individually activate the capacitive sampling channels in a time sequential manner such that only one capacitive sampling channel is active at a time. In other embodiments, more than one capacitive sampling channel may be active at the same time.

In the example of FIG. 1, the readout system 104 includes a buffer 122, an analog-to-digital converter (ADC) 124, and a digital signal processor 5 (DSP) 126. The buffer is configured to buffer an analog signal that is output from the output interface of the capacitive sampling array. For example, the buffer is configured to buffer a voltage received from the capacitive sampling array. Buffers are known in the field and not described further. The ADC is configured to convert analog signals from the buffer to digital signals. For example the ADC is configured to digitize a time series of signal pulses into a time series of digital data. ADCs are known in the field and not described further herein.

The DSP 126 of the readout system 104 is configured to process the time series of digital data that is generated by the ADC 124 and provided to the DSP. As illustrated in FIG. 1, the DSP outputs digital data 128 in response to receiving the input signal at the input interface 108 of the capacitive sampling array 102. For example, the digital data may be digital data that represents the magnitude (e.g., in terms of measured voltage) and timing of the input signal.

As also illustrated in FIG. 1, the DSP 126 outputs digital data 130 to the controller 106. The digital data output to the controller from the DSP may be the same digital data as described above, or the digital data output to the controller from the DSP may be different, or may include some of the same digital data and some different digital data. In an example, the DSP is configured to implement a signal sampling algorithm, for example, a signal sampling algorithm that controls the selection of the capacitive sampling channels 120 of the capacitive sampling array 102 in response to digital data received from ADC 124 in a manner that uses larger capacitors to sample lower magnitude signals and that uses smaller capacitors to sample higher magnitude signals, which can help to maintain a desirable SNR over a wide range of signal magnitudes. In one example, the digital data 130 that is provided to the controller 106 from the DSP includes capacitive weights (e.g., information about the magnitude of a desired capacitance) and corresponding timing information, which is used by the controller to select capacitive sampling channels and to control the time of such selection. In an example in which the input signal involves repetitive input signals/pulses, the DSP can extract information about the waveform sampled by the capacitive sampling array 102 and generate updated capacitance values and time delays, which are provided to controller 106 for use in changing the capacitor sizes and/or sampling time delays that are implemented by the capacitive sampling array 102 to optimize the SNR for subsequent input signals/pulses. In some embodiments, the DSP can also use Artificial Intelligence or Machine Learning models to predict the next signal or signals in a case of non-repetitive signals/pulses.

Although some operations of the DSP 126 are described, the DSP may be configured to implement other operations. Additionally, although an example of the readout system 104 is described with reference to FIG. 1, other embodiments of a readout system may be used to process signals received from the capacitive sampling array 102 and to provide digital feedback data to the controller 106.

The controller 106 is configured to generate control signals 132 and to output the control signals to the capacitive sampling array 102 in response to the digital data 130 from the readout system 104. In the example of FIG. 1, the controller includes a timing element 134, a control element 136, and a finite state machine 138, which may be implemented in hardware, firmware, software, or a combination thereof. In an example, the timing element is configured to control the time intervals from sample to sample in response to feedback from the DSP. In an example the control element is configured to manage the selection of capacitive sampling channels in response to feedback from the DSP. In an example, the finite state machine is configured to implement a signal sampling algorithm, for example, a signal sampling algorithm that controls the selection of the capacitive sampling channels 120 of the capacitive sampling array 102 in response to feedback from the readout system 104 (e.g., in response to the digital data 130) in a manner that uses larger capacitors to sample lower magnitude signals and that uses smaller capacitors to sample higher magnitude signals, which can help to maintain a desirable SNR over a wide range of signal magnitudes. Although an example of the controller is described with reference to FIG. 1, other embodiments of the controller are possible. In an example, the controller is implemented in a microcontroller, such as a microcontroller IC device. As illustrated in FIG. 1, the readout system and the controller combine to form a feedback loop that is used to control the selection of capacitive sampling channels in the capacitive sampling array.

Figure 2:
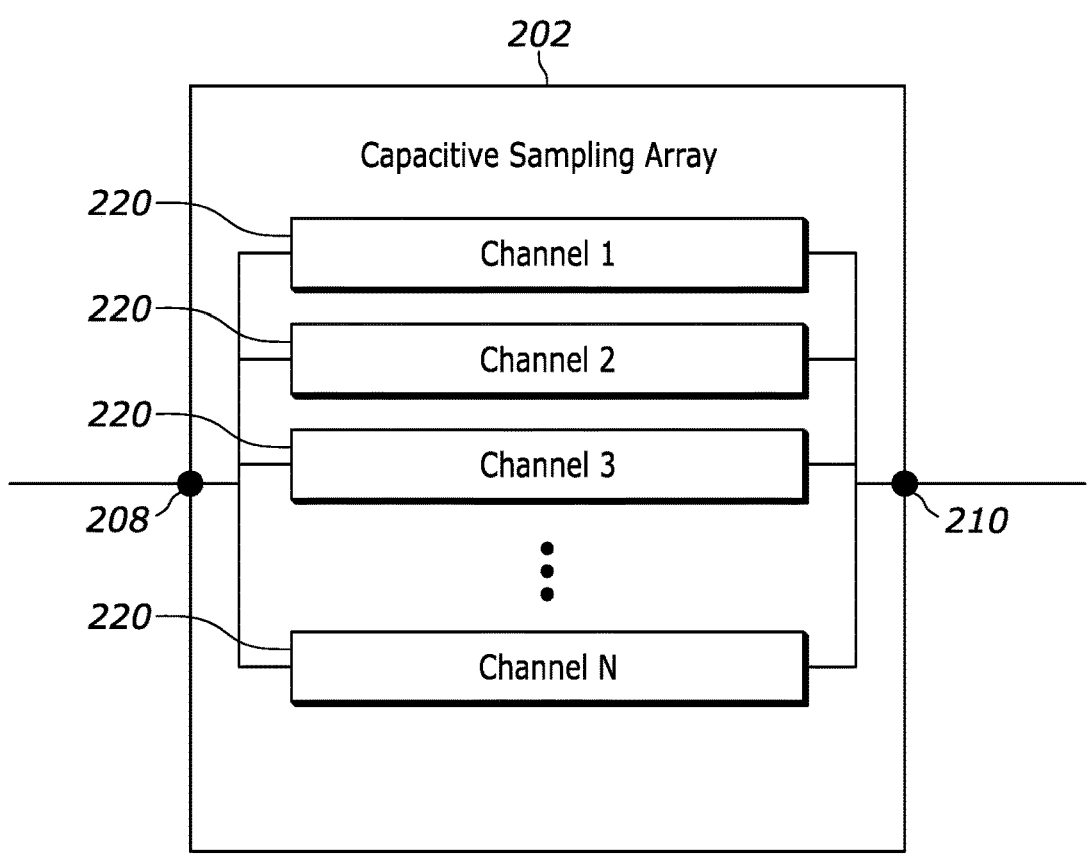
FIG. 2 depicts an example of a capacitive sampling array, such as the capacitive sampling array described with reference to FIG. 1.

FIG. 2 depicts an example of a capacitive sampling array 202, such as the capacitive sampling array 102 described with reference to FIG. 1. The capacitive sampling array includes an input interface 208, an output interface 210, and capacitive sampling channels 220 that are connected in parallel between the input interface and the output interface. The capacitive sampling channels each have a channel-specific capacitor (not shown) that has a channel-specific capacitance. FIG. 2 shows the parallel connection of the capacitive sampling channels between the input interface and the output interface. In one example, the number of parallel capacitive sampling channels is 25 (e.g., N=25), and in other examples, the number of parallel capacitive sampling channels may be 12, 24, 48, or 64, although other integer numbers of capacitive sampling channels greater than one are possible.

Figure 3A:
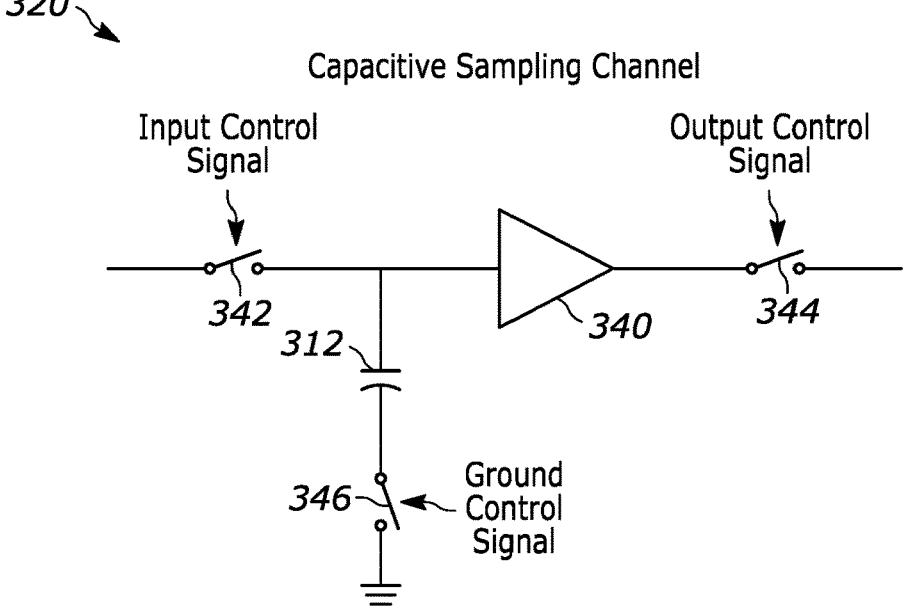
FIG. 3A is an expanded view of an example of one capacitive sampling channel in a capacitive sampling array.

FIG. 3A is an expanded view of an example of one capacitive sampling channel 320 in a capacitive sampling array, such as the capacitive sampling arrays 102 and 202 described with reference to FIGS. 1 and 2. In the example of FIG. 3A, the capacitive sampling channel has a capacitor 312, a buffer 340, an input control switch 342, an output control switch 344, and a ground control switch 346. The input control switch is controlled by an input control signal from the controller, the output control switch is controlled by an output control signal from the controller, and the ground control switch is controlled by a ground control signal from the controller. In operation, the capacitive sampling channel can be set to one of three states, a sensing state, a sample state, and a read state. Further, the switches of all of the capacitive sampling channels in the capacitive sampling array can be controlled to individually activate the capacitive sampling channels for channel-specific sampling.

Figure 3B:
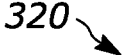
FIG. 3B illustrates an example of the sensing state of the capacitive sampling channel.
Figure 3B:
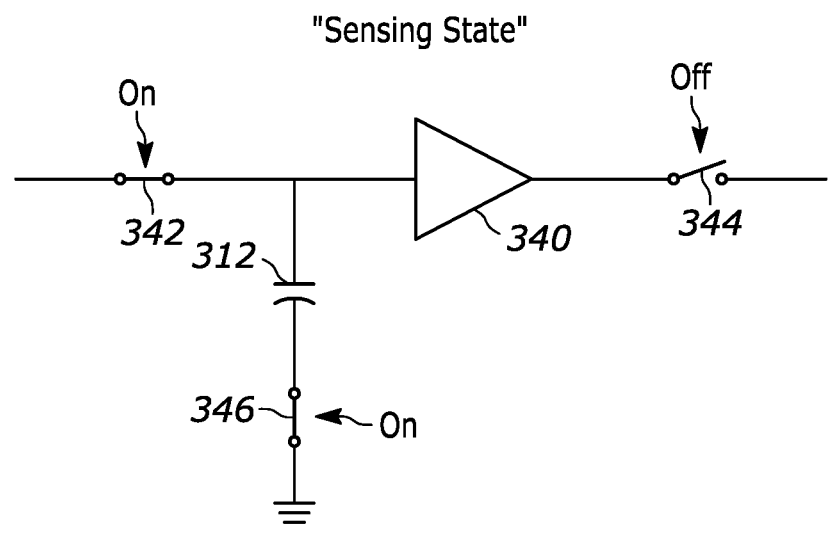

FIG. 3B illustrates an example of the sensing state of the capacitive sampling channel 320 described with reference to FIG. 3A. In the sensing state, the input control switch 342 is on, the output control switch 344 is off, and the ground control switch 346 is on. For example, the input control switch is on in response to the input control signal being high, the output control switch is off in response to the output control switch being low, and the ground control switch is off in response to the ground control signal being high. When the capacitive sampling channel is in the sensing state as shown in FIG. 3B, the capacitor 312 is charged by a signal that is received on the input interface of the capacitive sampling array.

Figure 3C:
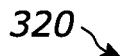
FIG. 3C illustrates an example of the sample state of the capacitive sampling channel.
Figure 3C:
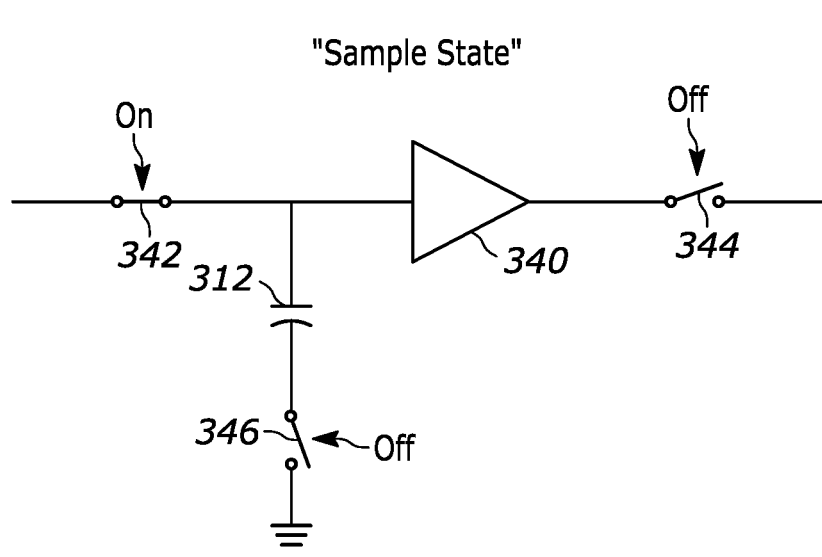

FIG. 3C illustrates an example of the sample state of the capacitive sampling channel 320 described with reference to FIG. 3A. In the sample state, the input control switch 342 is on, the output control switch 344 is off, and the ground control switch 346 is off. For example, the input control switch is on in response to the input control signal being high, the output control switch is off in response to the output control switch being low, and the ground control switch is off in response to the ground control signal being low. When the capacitive sampling channel is in the sample state as shown in FIG. 3B, the capacitor 312 is holding the charge across the capacitor that was sensed on the capacitive sampling array during the sensing state.

Figure 3D:
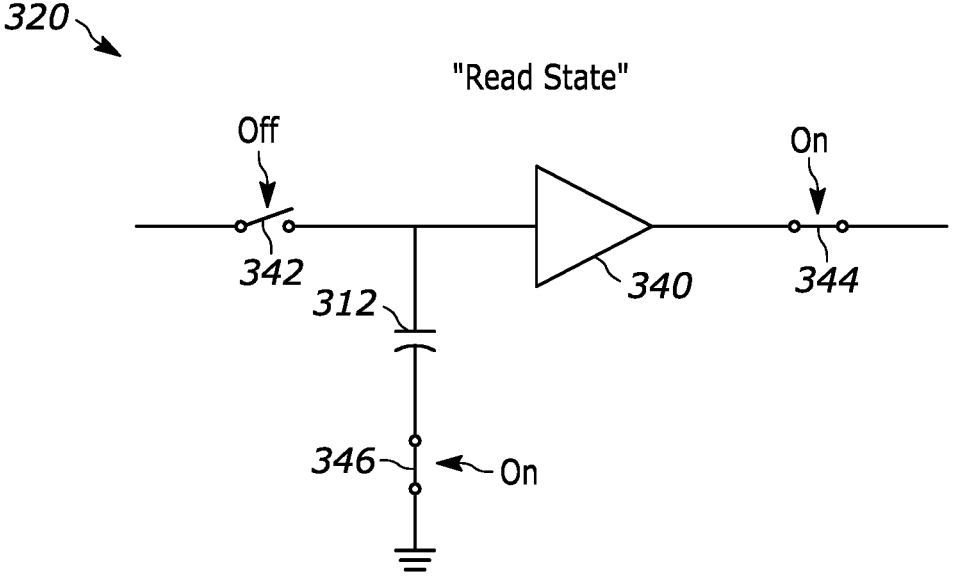
FIG. 3D illustrates an example of the read state of the capacitive sampling channel.

FIG. 3D illustrates an example of the read state of the capacitive sampling channel 320 described with reference to FIG. 3A. In the read state, the input control switch 342 is off, the output control switch 344 is on, and the ground control switch 346 is on. For example, the input control switch is off in response to the input control signal being low, the output control switch is on in response to the output control switch being high, and the ground control switch is on in response to the ground control signal being high. When the capacitive sampling channel is in the read state as shown in FIG. 3C, the voltage across the capacitor 312 is exposed to the output interface of the capacitive sampling array so that the voltage across the capacitor can be read by the readout system.

In an example, a capacitive sampling channel that progresses through the sensing state (FIG. 3B), the sample state (FIG. 3C), and then the read state (FIG. 3D) is considered to be an active, or activated, capacitive sampling channel. In an example, the states of each of the capacitive sampling channels in a capacitive sampling array are controlled by the controller using channel-specific input, output, and ground control signals. Thus, the channel-specific input, output, and ground control signals enable the capacitive sampling channels of a capacitive sampling array to be individually activated by a controller.

Figure 4:
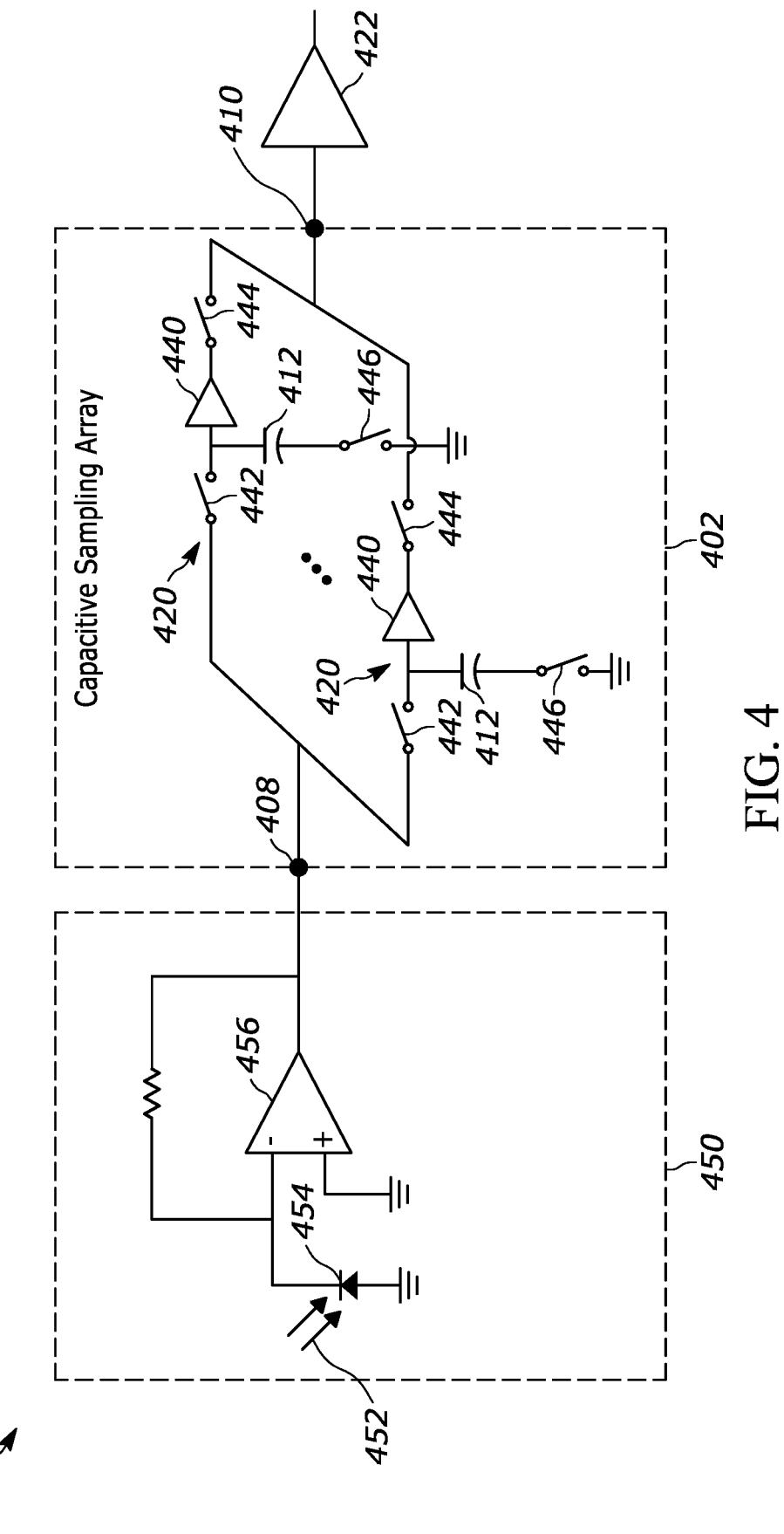
FIG. 4 is an example of a sensor system that includes a capacitive sampling array.

FIG. 4 is an example of a sensor system 400 that includes a capacitive sampling array 402 as described above. In the example of FIG. 4, the sensor system includes a sensor circuit 450 that produces a signal in response to electromagnetic energy 452 in an optical spectrum, such as laser light as used in lidar sensors. In the example of FIG. 4, the sensor system includes a photodiode 454 that produces an electrical current in response to light that is incident on the photodiode. The output signal is provided to a transimpedance amplifier 456, and the transimpedance amplifier has its output connected to the input interface 408 of the capacitive sampling array 402. The capacitive sampling array has multiple capacitive sampling channels 420 that are connected in parallel between the input interface 408 and the output interface 410 with each capacitive sampling channel 420 including a capacitor 412, a buffer 440, an input control switch 442, an output control switch 444, and a ground control switch 446. The capacitive sampling array 402 is shown as connected to a buffer 422, such as the buffer of the readout system described with reference to FIG. 1. An example of the capacitive sampling channels is described above, and although only two capacitive sampling channels are shown in FIG. 4, the capacitive sampling array may include N capacitive sampling channels connected in parallel, where N is an integer greater than one.

An example operation of a sampling system as described above with reference to FIGS. 1-4 is described with reference to FIGS. 5A and 5B.

Figure 5A:
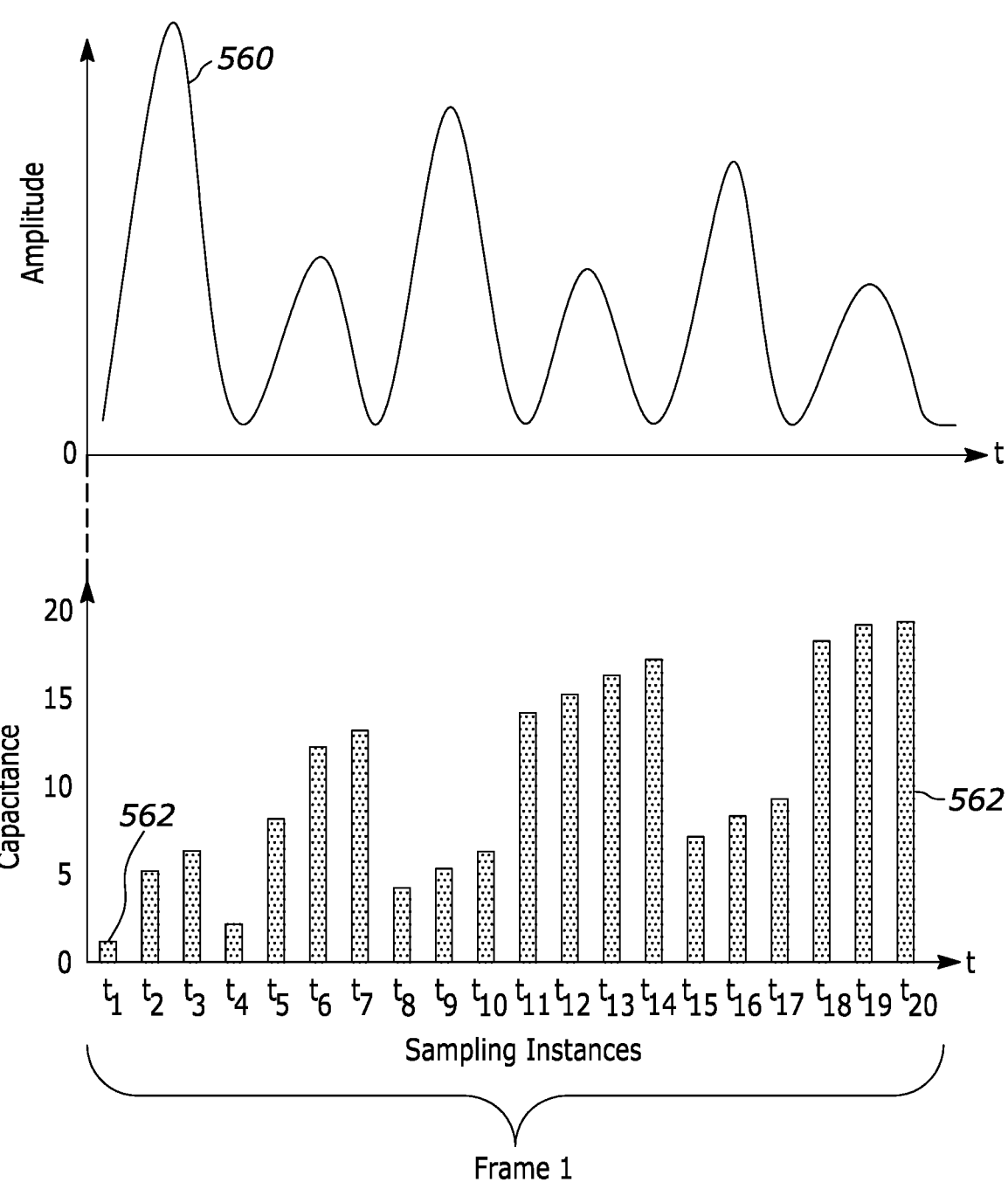
FIG. 5A depicts an input signal relative to a time series of sampling instances in a frame of sampling instances.

FIG. 5A depicts an input signal 560 relative to a time series of sampling instances 562, where a sampling instance includes a specific time (or time interval) of the sample and a specific capacitive sampling channel that is activated for sampling at the corresponding time. With regard to the input signal, FIG. 5A depicts the magnitude (e.g., as amplitude) of the input signal (on the y-axis) versus the time of the signal (on the x-axis), and with regard to the sampling instances, FIG. 5A depicts a capacitance of the sampling instance (on the y-axis) and the corresponding time of the sampling instance (on the x-axis). Thus, FIG. 5A illustrates a time-aligned relationship between the input signal 560 and the sampling instances 562 that are implemented by the sampling system for that part of the input signal. In the example of FIG. 5A, there are twenty sampling instances identified as sampling instances 1 through 20 (which corresponds to times $t_1$-$t_{20}$) and the twenty sampling instances make up one frame of sampling instances, identified herein as frame 1. In an example in which the capacitive sampling array includes 25 capacitive sampling channels, N=25, the frame of sampling instances may be identified as:

sampling instance 1: $t_1$(capacitive sampling channel 1);
sampling instance 2: $t_2$(capacitive sampling channel 5);
sampling instance 3: $t_3$(capacitive sampling channel 6);
sampling instance 4: $t_4$(capacitive sampling channel 2);
sampling instance 5: $t_5$(capacitive sampling channel 8);
sampling instance 6: $t_6$(capacitive sampling channel 12);
sampling instance 7: $t_7$(capacitive sampling channel 13);
sampling instance 8: $t_8$(capacitive sampling channel 4);
sampling instance 9: $t_9$(capacitive sampling channel 5);
sampling instance 10: $t_{10}$(capacitive sampling channel 6);
sampling instance 11: $t_{11}$(capacitive sampling channel 14);
sampling instance 12: $t_{12}$(capacitive sampling channel 15);
sampling instance 13: $t_{13}$(capacitive sampling channel 16);
sampling instance 14: $t_{14}$(capacitive sampling channel 17);
sampling instance 15: $t_{15}$(capacitive sampling channel 7);
sampling instance 16: $t_{16}$(capacitive sampling channel 8);
sampling instance 17: $t_{17}$(capacitive sampling channel 9);
sampling instance 18: $t_{18}$(capacitive sampling channel 18);
sampling instance 19: $t_{19}$(capacitive sampling channel 19); and
sampling instance 20: $t_{20}$(capacitive sampling channel 20).

where $t_x$ is the time of the sampling instance X and capacitive sampling channel Y is the channel number (e.g., from 1 to N) of the capacitive sampling channel that is active during the sampling instance. In an example, the specific configuration of the sampling instances (including the times and the channel numbers) forms a pattern of the sampling instances.

In the example of FIG. 5A, the capacitive sampling channel corresponding to each sampling instance 562 has a channel-specific capacitor having a channel-specific capacitance, and the relative capacitance amongst the capacitive sampling channels is represented in the figure by the relative height of the bars. As described above, it is desirable to select the capacitive sampling channels that are used to sample the signal in a manner that achieves a desired SNR, for example, in a manner that tries to achieve a high SNR (e.g., relative to a range of SNRs that result from the system) and/or to maximize the SNR. Thus, in an example, the pattern of capacitive sampling channels that is selected for the sampling instances in a frame of sampling instances may be changed, e.g., from frame-to-frame, with the goal of maintaining a desirable SNR (e.g., a high or maximum SNR) as the magnitude of the signal changes over a wide range of signal magnitudes.

Figure 5B:
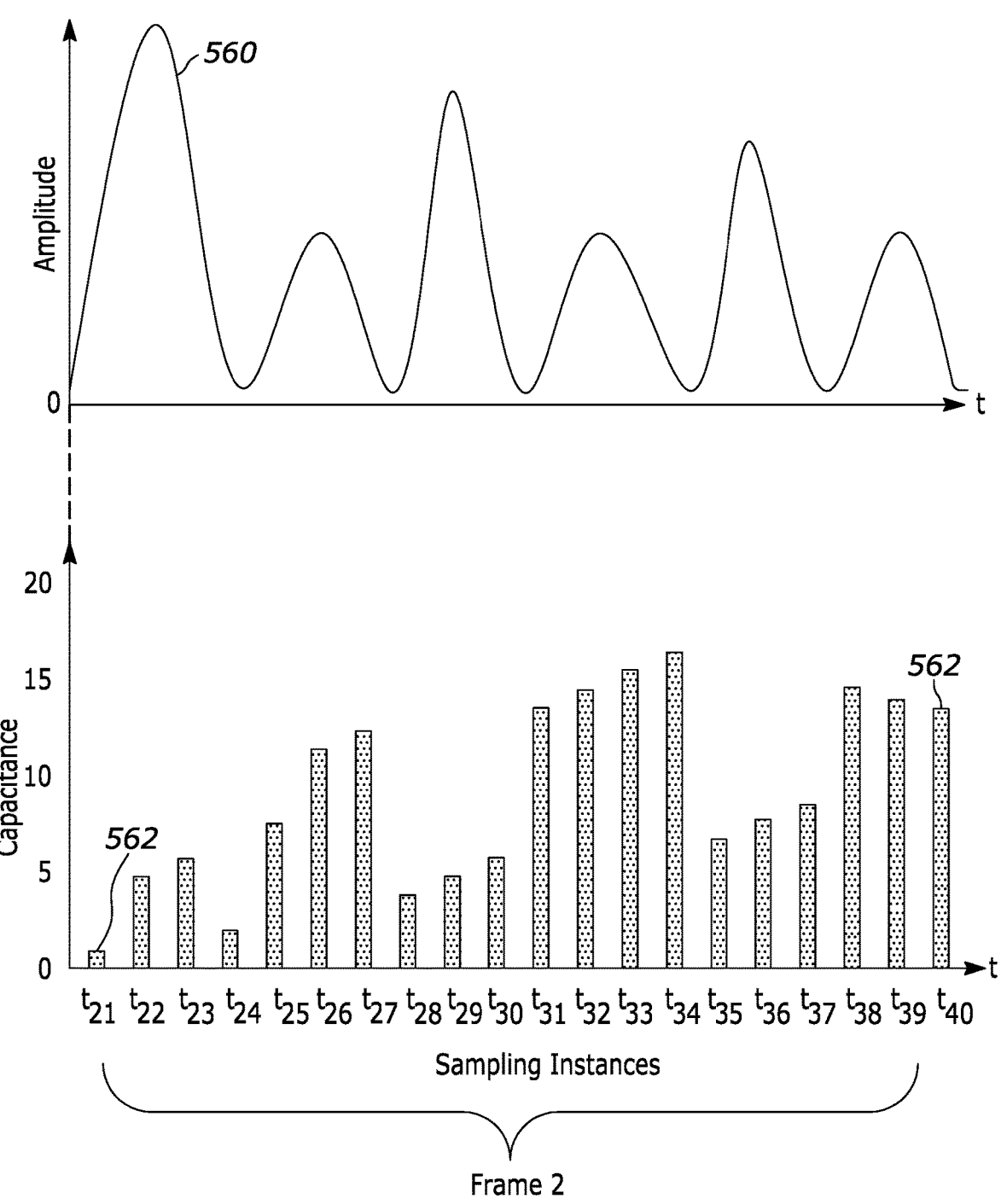
FIG. 5B depicts the input signal relative to a time series of sampling instances in a second frame of sampling instances.

FIG. 5B depicts a subsequent portion of the input signal 560 relative to a time series of sampling instances 562 in a second frame, frame 2, of sampling instances. In the example of FIG. 5B, the frame of sampling instances includes sampling instances 21 through 40 (which corresponds to times $t_{21}$-y $t_{40}$) and the sampling instances may be identified as:

sampling instance 21: $t_{21}$(capacitive sampling channel 1);
sampling instance 22: $t_{22}$(capacitive sampling channel 5);
sampling instance 23: $t_{23}$(capacitive sampling channel 6);
sampling instance 24: $t_{24}$(capacitive sampling channel 2);
sampling instance 25: $t_{25}$(capacitive sampling channel 8);
sampling instance 26: $t_{26}$(capacitive sampling channel 12);
sampling instance 27: $t_{27}$(capacitive sampling channel 13);
sampling instance 28: $t_{28}$(capacitive sampling channel 4);
sampling instance 29: $t_{29}$(capacitive sampling channel 5);
sampling instance 30: $t_{30}$(capacitive sampling channel 6);
sampling instance 31: $t_{31}$(capacitive sampling channel 14);
sampling instance 32: $t_{32}$(capacitive sampling channel 15);
sampling instance 33: $t_{33}$(capacitive sampling channel 16);
sampling instance 34: $t_{34}$(capacitive sampling channel 17);
sampling instance 35: $t_{35}$(capacitive sampling channel 7);
sampling instance 36: $t_{36}$(capacitive sampling channel 8);
sampling instance 37: $t_{37}$(capacitive sampling channel 9);
sampling instance 38: $t_{38}$(capacitive sampling channel 18);
sampling instance 39: $t_{39}$(capacitive sampling channel 19); and
sampling instance 40: $t_{40}$(capacitive sampling channel 20).

again, where $t_x$ is the time of the sampling instance X and capacitive sampling channel Y is the channel number (e.g., from 1 to N) of the capacitive sampling channel that is active during the sampling instance. In an example, the specific configuration of the sampling instances (including the times and the channel numbers) forms a pattern of the sampling instances.

In the example of FIG. 5B, the input signal 560 has stayed stable from frame-to-frame (e.g., the signal has a pulse pattern that is similar from frame-to-frame) but a few of the sampling instances 562 in frame 2 have used different sampling channels to sample the signal. For example, the capacitive sampling channels active at time instances $t_{38}$ to $t_{40}$ have been changed by the controller to capacitive sampling channels that have a smaller capacitance to adapt the sampling system to a signal that is anticipated to have a higher magnitude at the time of the sampling instances. In the example of FIGS. 5A and 5B, the time interval between sampling instances is constant and the variable that is controlled to manage the SNR is the selection of capacitive sampling channels. Thus, FIGS. 5A and 5B illustrate changes in capacitive sampling channels that can be made from frame to frame by the controller in response to a received signal.

Figure 6:
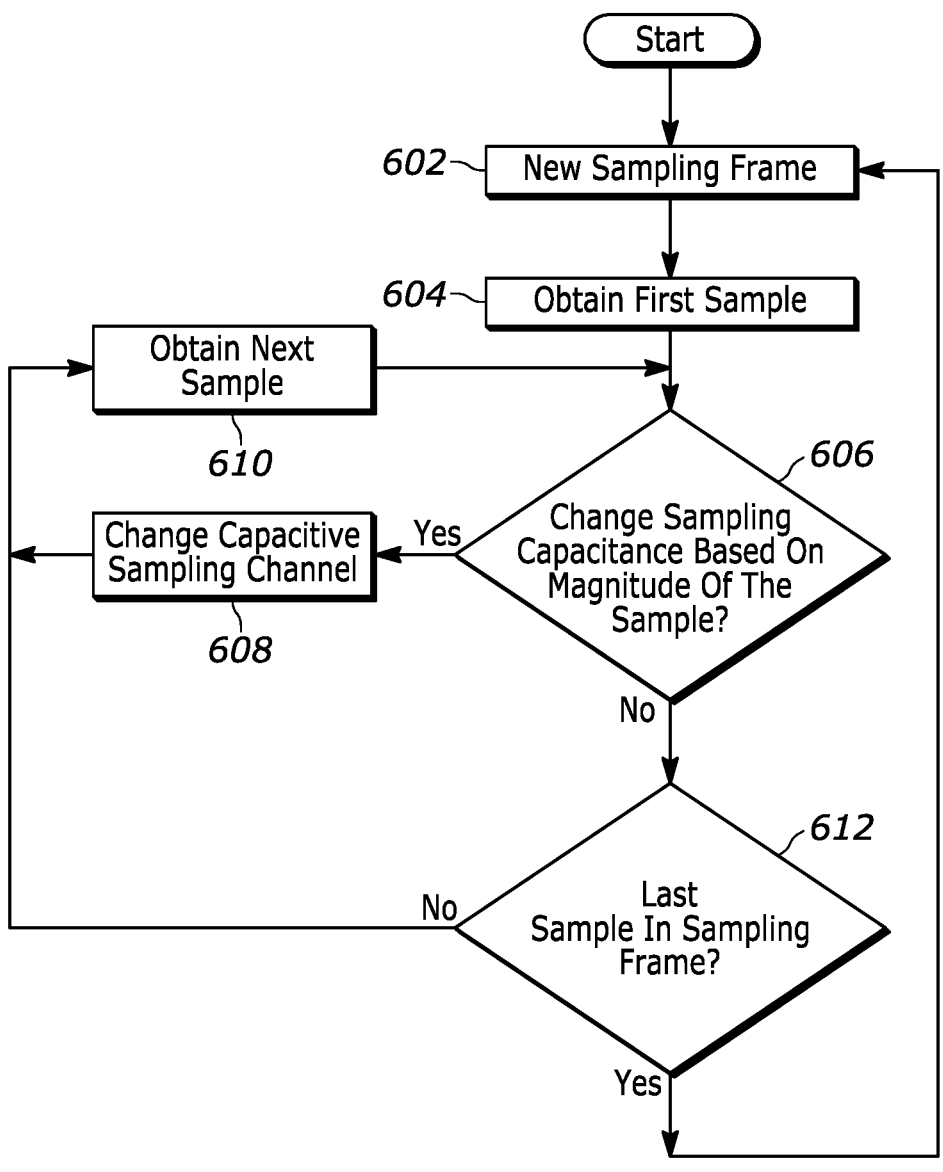
FIG. 6 is a flow diagram of a process for operating a sampling system.

FIG. 6 is a flow diagram of a process for operating a sampling system such as the system described above. After starting the process, at block 602, a new sampling frame is started. At block 604, a first sample of the sampling frame is obtained. Next, at decision point 606, it is determined whether a sampling capacitance should be changed (e.g., tuned) based on the magnitude of the sample. If it is determined that the sampling capacitance should be changed, then the process proceeds to block 608 where the capacitive sampling channel is changed in order to change the sampling capacitance. For example, the capacitive sampling channel of a sampling instance in the frame may be changed to a capacitive sampling channel with a smaller capacitance in response to a portion of the signal that has a higher magnitude than a previous portion of the signal, or the capacitive sampling channel of a sampling instance in the frame may be changed to a capacitive sampling channel with a larger capacitance in response to a portion of the signal that has a lower magnitude than a previous portion of the signal. After the capacitive sampling channel is changed, the process proceeds to block 610, at which point a next sample in the frame is obtained. After the next sample is obtained, the process returns to decision point 606. If, at decision point 606 it is determined that the sampling capacitance does not need to be changed, then the process proceeds to decision point 612. At decision point 612, it is determined whether the sample is the last sample in the frame. If the sample is not the last sample in the frame, then the process proceeds to block 610, at which point a next sample in the frame is obtained. However, if the sample is the last sample in the frame, then the process proceeds to block 602 to begin a new sampling frame.

Figure 7:
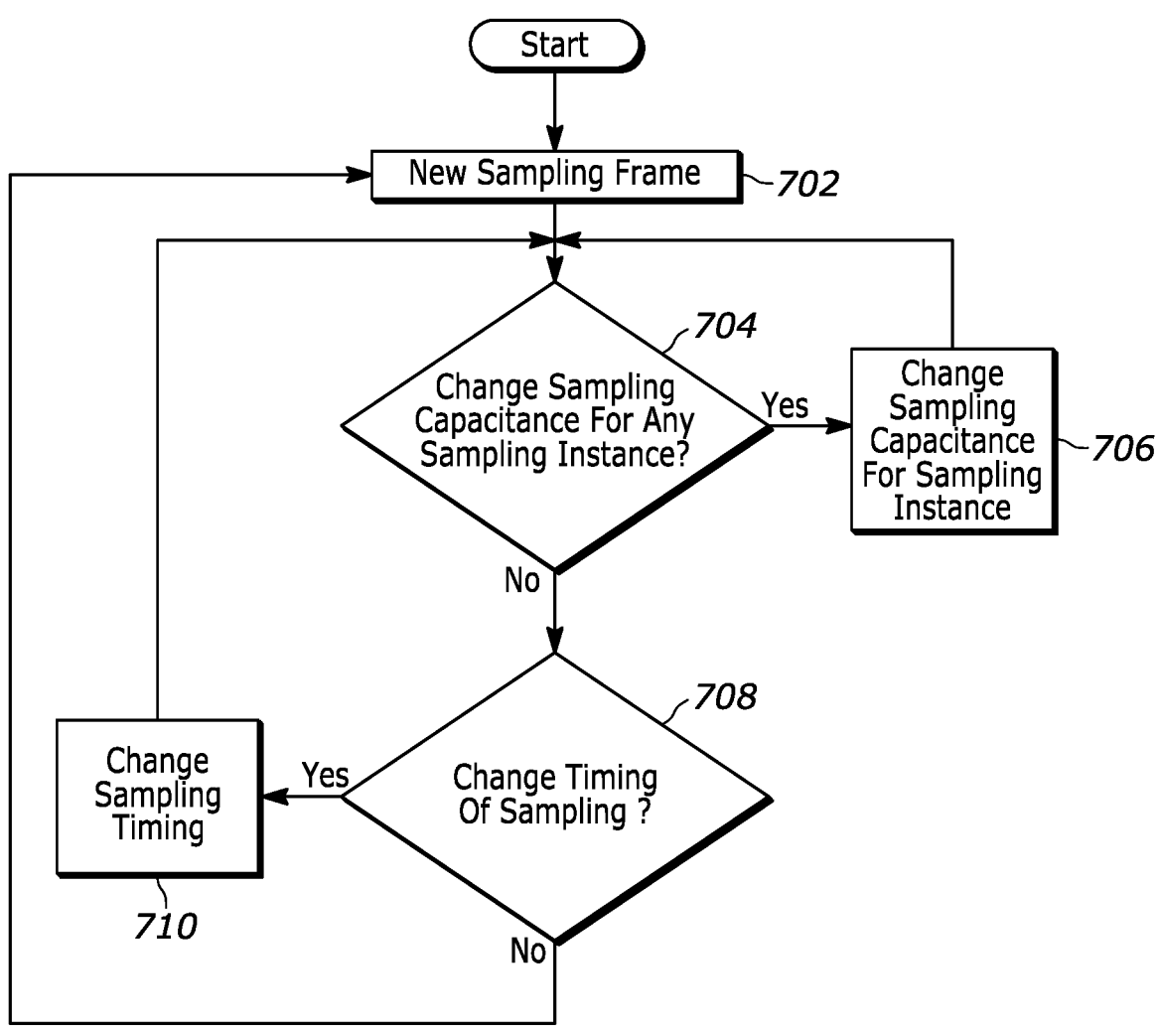
FIG. 7 is a flow diagram of a process for operating a sampling system in which capacitance and/or timing may be changed in response to the input signal.

In the examples described above, the time interval between sampling instances is constant and the variable that is controlled to manage the SNR is the channel selection, which corresponds to the sampling capacitance. In other examples, the timing of the sampling instances is controlled in addition to the channel selection. For example, the length of a single sampling instance, the time interval between sampling instances, and/or the number of sampling instances in a frame can be changed, e.g., in response to feedback from the readout system. FIG. 7 is a flow diagram of a process for operating a sampling system, such as the sampling system as described above, in which capacitance and/or timing may be changed in response to the input signal. Upon starting, the process proceeds to block 702 to begin a new sampling frame. The process then proceeds to decision point 704, at which it is determined whether the sampling capacitance for any sampling instance should be changed (e.g., tuned). If it is determined that a sampling capacitance for a sampling instance should be changed, then the process proceeds to block 706, at which point the sampling capacitance for the sampling instance is changed. The process then returns to decision point 704. However, if it is determined that the sampling capacitance for any sampling instance does not need to be changed, then the process proceeds to decision point 708. At decision point 708, it is determined whether the timing of the sampling instance should be changed. If it is determined that the timing of the sampling instance should be changed, then the process proceeds to block 710, at which point the timing of sampling instance is changed. In an example that includes two pulses of 1V (pulse 1) and 100 mV (pulse 2), respectively, and each pulse being 100 nano seconds (ns) wide, pulse 1 may have sampling timing separated by 10 ns with 10 samples for the 100 ns wide pulse, and pulse 2 may have a timing separation of 1 ns with 100 samples for the 100 ns wide pulse. In the case of pulse 2, the delays between the samples are reduced with an increased number of capacitors allocated to the small amplitude pulse. In an example, the logic may be implemented within the Finite State Machine 138 to increase the sampling rate and SNR. The process then returns to decision point 704. However, if it is determined that the timing of sampling does not need to be changed, then the process returns to block 702.

In the examples described above with reference to FIGS. 5A, 5B, 6, and 7, the sampling instances are managed on a per-frame basis. For example, a fixed number of sampling instances is included in each frame and the pattern of sampling instances in the frames is updated as needed on a per-frame basis. In other examples, the parameters of the sampling instances (e.g., the capacitance and/or the timing) may be controlled on a sampling instance-per-sampling instance basis. For example, the controller can predict a future state of the signal from a current state of the signal and then select a parameter of a subsequent sampling instance (e.g., the capacitance of the capacitive sampling channel) in response to the prediction.

Figure 8:
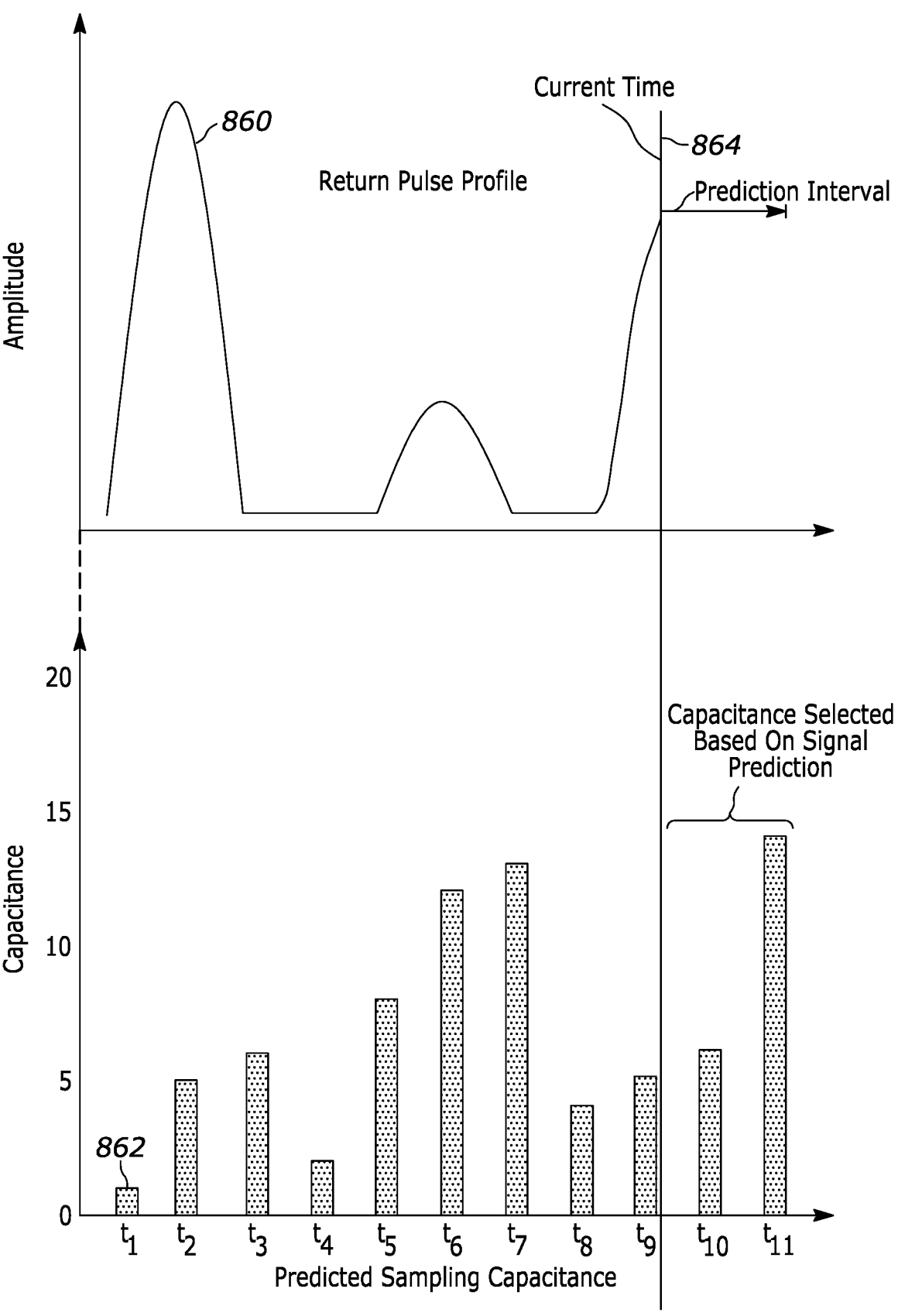
FIG. 8 illustrates a portion of a signal and time-aligned sampling instances.

FIG. 8 illustrates a portion of a signal 860 and time-aligned sampling instances 862 similar to what is described with reference to FIGS. 5A and 5B. However, FIG. 8 includes a vertical line 864 that represents the current time of the sampling operation. As illustrated in FIG. 8, at the current time, only the portion of the signal that has been sampled is known. While only the portion of the signal that has been sampled is known, the known portion of the signal can be used to make a prediction about a future portion of the signal. For example, from the known portion of the signal, it may be determined that the magnitude of the signal is rising (e.g., from a rising edge of the signal) and thus a future portion of the signal is likely to have a higher magnitude than a current portion of the signal, or it may be determined that the magnitude of the signal is falling (e.g., from a falling edge of the signal) and thus a future portion of the signal is likely to have a lower magnitude than a current portion of the signal. Given such a prediction about the future state of the signal, a parameter of the sampling instance (e.g., capacitance and/or timing) may be selected based on the predicted future state of the signal. In an example, if the magnitude of the signal is determined to be rising, then a capacitive sampling channel for a subsequent sampling instance can be selected in view of the rising magnitude, e.g., a capacitive sampling channel with a smaller capacitance may be selected for a subsequent sampling instance, and, in contrast, if the signal is determined to be falling, then a capacitive sampling channel for a subsequent sampling instance can be selected in view of the falling magnitude, e.g., a capacitive sampling channel with a larger capacitance may be selected for a subsequent sampling instance. In an example, the number of subsequent sampling instances that can be defined based on a prediction about the signal is implementation specific, and may range from, for example, 1-20 subsequent samples.

Figure 9:
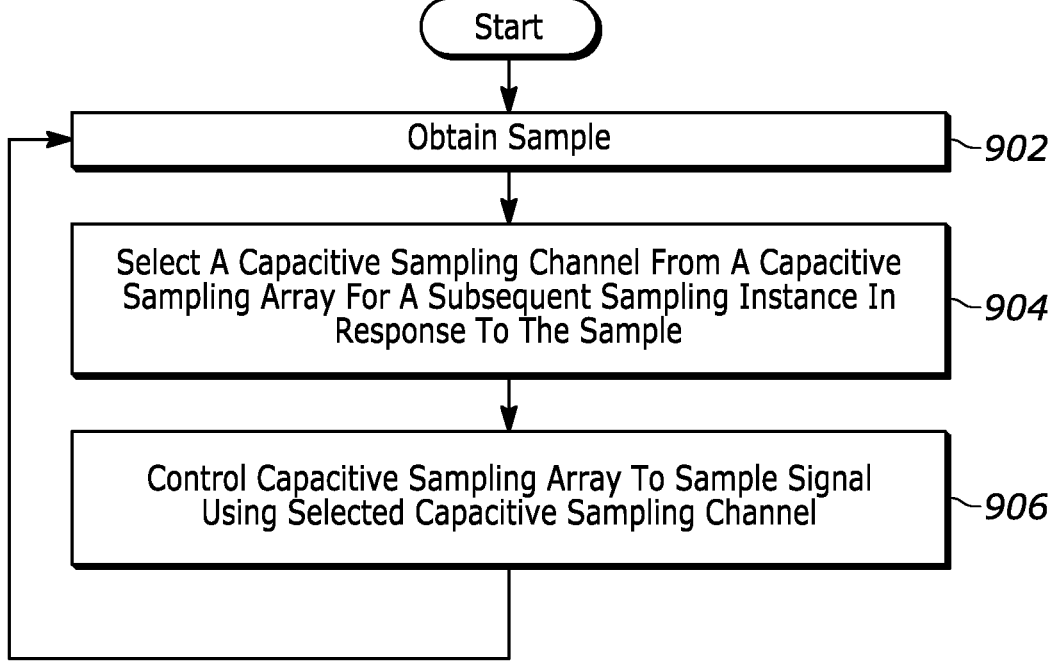
FIG. 9 is a flow diagram of a process for operating a sampling system in which capacitive sampling channels can be selected based on predictions of the future state of the signal.

FIG. 9 is a flow diagram of a process for operating a sampling system, such as the sampling system described above, in which capacitive sampling channels can be selected based on predictions of the future state of the signal. Upon starting the process, at block 902, a sample is obtained. For example, a sample is obtained from one of the capacitive sampling channels in a capacitive sampling array. Next, at block 904, a capacitive sampling channel is selected from a capacitive sampling array for a subsequent sampling instance in response to the sample. For example, if the magnitude of the signal is determined to be rising from the sample (e.g., in view of a slope calculated from a set of previous samples), then a capacitive sampling channel for a subsequent sampling instance can be selected in view of the rising magnitude, e.g., a capacitive sampling channel with a smaller capacitance may be selected for a subsequent sampling instance, and, in contrast, if the signal is determined to be falling from the sample (e.g., in view of a slope calculated from a set of previous samples), then a capacitive sampling channel for a subsequent sampling instance can be selected in view of the falling magnitude, e.g., a capacitive sampling channel with a larger capacitance may be selected for a subsequent sampling instance. Next, at block 906, the capacitive sampling array is controlled to sample the signal using the selected capacitive sampling channel. The process then returns to block 902.

In some examples, applying the approach disclosed herein can help to improve time-of-flight accuracy in lidar systems to less than 5 cm.

As used herein, a larger capacitor may refer to a capacitor device that has more capacitance (e.g., in terms of farads) than a smaller capacitor. Additionally, as used herein a signal with higher magnitude may refer to a signal that has more amplitude (e.g., in terms of measured voltage) than a signal with lower magnitude.

In the examples described above, the sampling mechanism utilizes capacitors to sample a signal generated from a sensor circuit such as a photodiode. However, in other examples a sampling array that utilizes other sensing circuits may be used. Thus, a sampling array with parallel sampling channels may utilize sensing circuits other than capacitor-based sampling circuits.

Although the operations of the method(s) herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

It should also be noted that at least some of the operations for the methods described herein may be implemented using software instructions stored on a computer useable storage medium for execution by a computer. As an example, an embodiment of a computer program product includes a computer useable storage medium to store a computer readable program.

The computer-useable or computer-readable storage medium can be an electronic, magnetic, optical, electromagnetic, infrared, or semiconductor system (or apparatus or device). Examples of non-transitory computer-useable and computer-readable storage media include a semiconductor or solid state memory, magnetic tape, a removable computer diskette, a random access memory (RAM), a read-only memory (ROM), a rigid magnetic disk, and an optical disk. Current examples of optical disks include a compact disk with read only memory (CD-ROM), a compact disk with read/write (CD-R/W), and a digital video disk (DVD).

Alternatively, embodiments of the invention may be implemented entirely in hardware or in an implementation containing both hardware and software elements. In embodiments which use software, the software may include but is not limited to firmware, resident software, microcode, etc.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. A system comprising:
a capacitive sampling array having an input interface, an output interface, and capacitive sampling channels connected in parallel between the input interface and the output interface, wherein each capacitive sampling channel has a channel-specific capacitor having a channel-specific capacitance;
a readout system coupled to the output interface of the capacitive sampling array and configured to generate digital data in response to a signal received on the input interface of the capacitive sampling array; and
a controller coupled to the readout system to receive the digital data and configured to select capacitive sampling channels of the capacitive sampling array to sample the signal in response to the digital data.

2. The system of claim 1, wherein the controller is configured to change a pattern of sampling instances in a frame of sampling instances in response to a magnitude of the signal received on the input interface, wherein a sampling instance includes a selected capacitive sampling channel.

3. The system of claim 2, wherein the controller is further configured to:
change a capacitive sampling channel of a sampling instance in the frame to a capacitive sampling channel with a smaller capacitance in response to a portion of the signal that has a higher magnitude than a previous portion of the signal; and
change a capacitive sampling channel of a sampling instance in the frame to a capacitive sampling channel with a larger capacitance in response to a portion of the signal that has a lower magnitude than a previous portion of the signal.

4. The system of claim 2, wherein the controller is further configured to:
select a capacitive sampling channel with a smaller capacitance to correspond to a portion of the signal with a higher magnitude; and
select a capacitive sampling channel with a larger capacitance to correspond to a portion of the signal with a lower magnitude.

5. The system of claim 1, wherein the controller is configured to select a capacitive sampling channel from the capacitive sampling channel array for a subsequent sampling instance in response to a magnitude of the signal received on the input interface.

6. The system of claim 5, wherein the controller is further configured to:
select a capacitive sampling channel for a subsequent sampling instance that has a larger capacitance than a previous sampling instance in response to digital data that indicates a rising edge of the signal; and
select a capacitive sampling channel for a subsequent sampling instance that has a smaller capacitance than a previous sampling instance in response to digital data that indicates a falling edge of the signal.

7. The system of claim 1, wherein the channel-specific capacitors of each capacitance sampling channel is a function of a unit capacitor.

8. The system of claim 7, wherein a first capacitive sampling channel in the capacitive sampling array has more unit capacitors than a second capacitive sampling channel array such that the first capacitive sampling channel has a larger capacitance than the second capacitive sampling channel.

9. The system of claim 1, wherein the capacitive sampling channels of the capacitive sampling array include channel-specific switches that enable the capacitive sampling channels to be individually activated for sampling the input signal.

10. The system of claim 1, wherein the controller is further configured to:

increase a sampling rate of the system in response to a portion of the signal that has a higher magnitude; and decrease the sampling rate of the system in response to a portion of the signal that has a lower magnitude.

11. A method comprising:

obtaining a sample of a signal from a capacitive sampling array having an input interface, an output interface, and capacitive sampling channels connected in parallel between the input interface and the output interface, wherein each capacitive sampling channel has a channel-specific capacitor having a channel-specific capacitance;

selecting a capacitive sampling channel from the capacitive sampling array for a subsequent sampling instance in response to the sample; and controlling the capacitive sampling array to sample the signal in the subsequent sampling instance using the selected capacitive sampling channel.

12. The method of claim 11, wherein selecting a capacitive sampling channel from the capacitive sampling array for a subsequent sampling instance in response to the sample involves changing a pattern of sampling instances in a frame of sampling instances in response to a magnitude of the signal, wherein a sampling instance includes a selected capacitive sampling channel.

13. The method of claim 12, further comprising:

changing a capacitive sampling channel of a sampling instance in the frame to a capacitive sampling channel with a smaller capacitance in response to a portion of the signal has a higher magnitude than a previous portion of the signal; and changing a capacitive sampling channel of a sampling instance in the frame to a capacitive sampling channel with a larger capacitance in response to a portion of the signal that has a lower magnitude than a previous portion of the signal.

14. The method of claim 11, wherein selecting a capacitive sampling channel from the capacitive sampling array for a subsequent sampling instance in response to the sample involves:

selecting a capacitive sampling channel with a smaller capacitance to correspond to a portion of the signal with a higher magnitude; and selecting a capacitive sampling channel with a larger capacitance to correspond to a portion of the signal with a lower magnitude.

15. The method of claim 11, wherein selecting a capacitive sampling channel from the capacitive sampling array for a subsequent sampling instance in response to the sample involves selecting a capacitive sampling channel from the capacitive sampling channel array for a subsequent sampling instance in response to a magnitude of the signal received on the input interface.

16. The method of claim 15, further comprising:

selecting a capacitive sampling channel for a subsequent sampling instance that has a smaller capacitance than a previous sampling instance in response to digital data that indicates a rising edge of the signal; and selecting a capacitive sampling channel for a subsequent sampling instance that has a larger capacitance than a previous sampling instance in response to digital data that indicates a falling edge of the signal.

17. A method for operating a system that samples an input signal, the method comprising:

selecting capacitive sampling channels with large channel-specific capacitance from a capacitive sampling array to sample portions of a signal that have low magnitude; and selecting capacitive sampling channels with small channel-specific capacitance from the capacitive sampling array to sample portions of the signal that have high magnitude;

wherein the capacitive sampling array includes an input interface to receive the signal, an output interface, and capacitive sampling channels connected in parallel between the input interface and the output interface, wherein each capacitive sampling channel has a channel-specific capacitor having a channel-specific capacitance; and wherein the large channel-specific capacitance has larger capacitance than the small channel-specific capacitance, and the portions of the signal that have low magnitude have lower magnitude than the portions of the signal that have high magnitude.

18. The method of claim 17, wherein the capacitive sampling channels are selected in response to digital data generated in response to samples of the signal generated by the capacitive sampling array.

\* \* \* \* \*